United States Patent [19]

Ueda

[11] 4,231,016
[45] Oct. 28, 1980

[54] INPUT SIGNAL RECOGNITION CIRCUIT
[75] Inventor: Shigeki Ueda, Nara, Japan
[73] Assignee: Matsushita Electric Industrial Co., Ltd., Osaka, Japan
[21] Appl. No.: 964,054
[22] Filed: Nov. 27, 1978
[30] Foreign Application Priority Data Dec. 2, 1977 [JP] Japan .............................. 50/145251

[51] Int. Cl.³ .......................... H04Q 9/00; G08C 9/00
[52] U.S. Cl. ............................ 340/166 R; 340/365 E; 178/17 C; 178/18
[58] Field of Search ............ 340/149 R, 365 S, 166 R, 340/365 E; 178/17 C, 18

[56] References Cited
U.S. PATENT DOCUMENTS

| | | | |
|---|---|---|---|
| 3,683,371 | 8/1972 | Holz | 340/365 S |
| 3,792,466 | 2/1974 | Arnold et al. | 340/365 S |
| 3,973,256 | 8/1976 | Stoesser et al. | 340/365 S |
| 4,020,467 | 4/1977 | Hashimoto et al. | 340/365 S |
| 4,106,011 | 8/1978 | Melanson et al. | 340/365 S |

*Primary Examiner*—Donald J. Yusko
*Attorney, Agent, or Firm*—Stevens, Davis, Miller & Mosher

[57] ABSTRACT

An input signal recognition circuit for a control system having an array of momentary switching elements (hereinafter referred to as "keys") whose number is larger than that of the array input terminals, which prevents erroneous control system operation which may occur upon simultaneous actuation of a plurality of keys. The control system with the input signal recognition circuit stably operates against key chattering and noise. The input signal recognition circuit comprises a keyboard including a plurality of keys arranged in a matrix, signals for sequentially sensing the actuation of keys on the respective columns of the matrix, an input buffer section which responds to the sensing signals to store the key data keyed in through the key actuation, a memory section for temporarily storing the key data and a recognition section for checking the contents of the memory section to detect whether any key has been actuated and for recognizing whether a plurality of keys in different columns of the matrix have been actuated. Only when a single key is actuated, or a plurality of keys in the same column are actuated, does the circuit identify that the input data is effective and generate a given control command signal in the control system.

3 Claims, 6 Drawing Figures

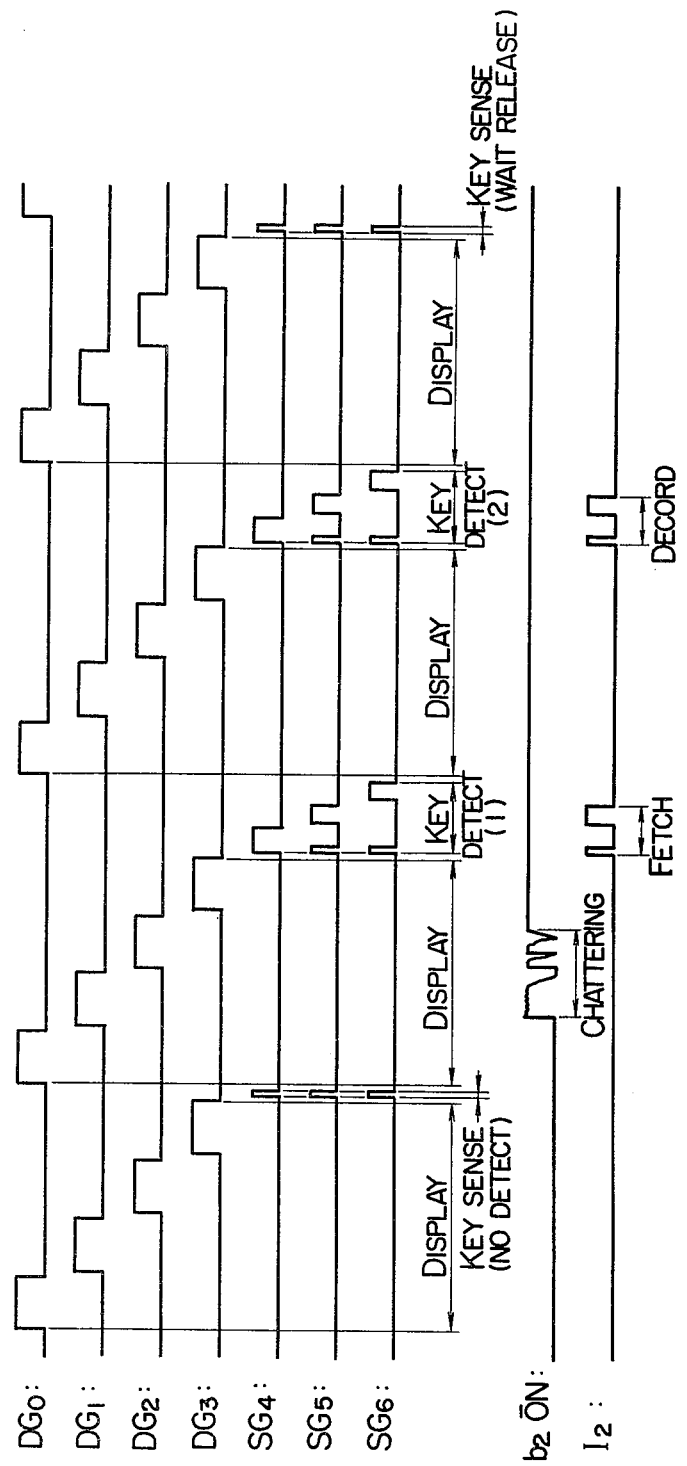

INPUT SIGNAL RECOGNITION CIRCUIT

The present invention relates to an input signal recognition circuit and, more particularly, to an input signal recognition circuit used with a plurality of control signal inputting keys in which a plurality of keys are simultaneously actuated when data is inputted.

FIG. 6 shows a set of wave forms of various signals at the respective portions in the circuit in FIG. 5.

Figure 1:
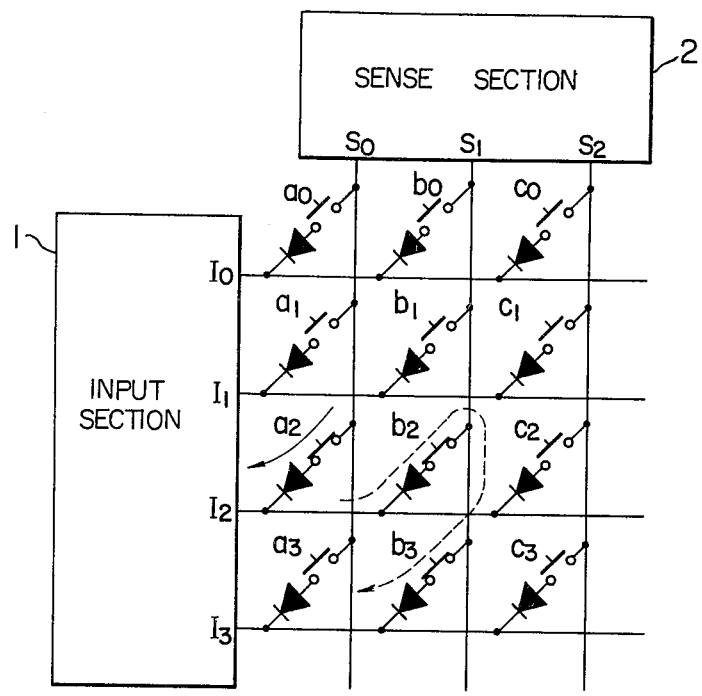
FIG. 1 shows a diagram of a conventional key matrix arrangement.
Figure 2:
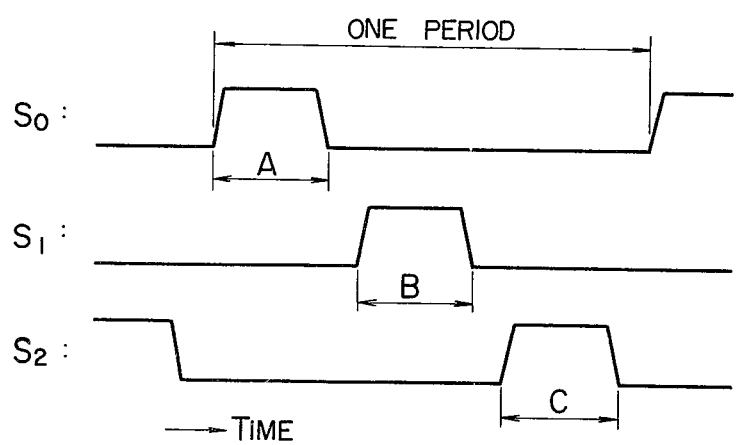
FIG. 2 shows a set of timing diagrams of various signals appearing at portions of the matrix arrangement shown in FIG. 1.

In a control system with a number of input keys such as a microwave oven, it is common practice that keys are arranged in a matrix fashion as shown in FIG. 1, for the purpose of reducing the number of the input and output terminals and signal lines to simplify the control system. In the example shown in FIG. 1, an input section 1 provided with input terminals Io to I3 is connected to twelve keys grouped into three columns each including four keys, $a_0$ to $a_3$, $b_0$ to $b_3$, and $c_0$ to $c_3$. The depression or non-depression of a key is sensed by sense signals $S_0$ to $S_2$ derived from a sense section 2. As shown in FIG. 2, in the sense signals, one period is divided into three segmental periods A, B and C. In the sensing of the key depression or actuation, four keys a-, b- or c- on each column are treated as a group. For example, when the key $a_2$ is depressed, the input terminal $I_2$ in the input section 1 becomes high (H) in level only at the sequential period A, or the time period, of the sense signal $S_0$. The control system judges what key is depressed by using the data from the input section 1 and a state of the sense signal currently executing the sensing operation. More particularly, since the terminal $I_2$ is at H level, it is identified that one of the keys $a_2$, $b_2$ and $c_2$ has been depressed. Since the sense signal $S_0$ is delivered from the sense section 2, it is further judged that the present time period is A. Depending on both the data, the control system judges that the key being depressed is the key $a_2$. Upon the judgement, a given operation command is issued into the control system. Incidentally, each key is provided with a diode connected in series therewith. The diode is used to prevent the system from erroneously operating when a plurality of keys are simultaneously depressed. If the diode is not used, when the keys $a_2$, $b_2$ and $b_3$ are simultaneously actuated, the sense signal So renders high in level not only the input terminal $I_2$ but also the input terminal $I_3$, through the keys $b_2$ and $b_3$. In other words, the system recognizes that the key $a_3$, which in fact is not actuated, is apparently actuated, together with the key $a_2$ which is actually actuated at the time period A. By convention, the diode connection as mentioned above is used to avoid such an erroneous recognition of key operation arising from the current filtering through.

This diode insertion method, however, has some disadvantages. The first disadvantage is that the insertion of the diode drops the voltage level at the input terminal. The forward voltage drop of a silicon diode is approximately 0.6 V. Accordingly, if the H level is 5 V, the sense signal of 5 V is dropped to 4.4 V at the input terminal. That is, the margin to the threshold level is narrowed by the forward voltage drop so that the system tends toward another erroneous operation problem. The second disadvantage is the reliability of the diodes since a large number of diodes are used. When a diode is broken, the key associated with the broken diode becomes inoperative. The third disadvantage is that the use of a number of diodes increases the manufacturing cost of the system.

Accordingly, an object of the invention is to provide an input signal recognition circuit for a control system with a key matrix as an input means which can prevent the control system from erroneously operating when a plurality of keys are simultaneously depressed.

Unlike the conventional system of this type, the input signal recognizing circuit according to the invention does not use the diodes to separate the keys from the sense signal group for the purpose of preventing the erroneous operation. There is no possibility of the erroneous operation due to the forward voltage drop of the diode. Additionally, the circuit of the invention stably operates against chattering of the keys and noise entering into the input section.

Another object of the invention is to provide an input signal recognition circuit enabling the period of the sense signal for searching the depression of the key to be shortened. The short period of the sense signal is effective to eliminate the flickering of a display tube when the display tube used is of dynamic drive type.

Still another object of the invention is to provide an input signal recognition circuit with a simple control system. When the control system is provided with a display tube of the dynamic drive type, the digit signal to drive the display tube is erased and at this time the segment signal line is used for the sense signal path. Therefore, the output terminals for the sense signals are saved. The sensing of the key actuation is carried out at the time that the display tube consumes no power. For this, the voltage drop across the power source is small and a large margin may be taken to the threshold level of the system. Additionally, this completely eliminates low lighting of the segments of the display tube not being driven.

Figure 3:
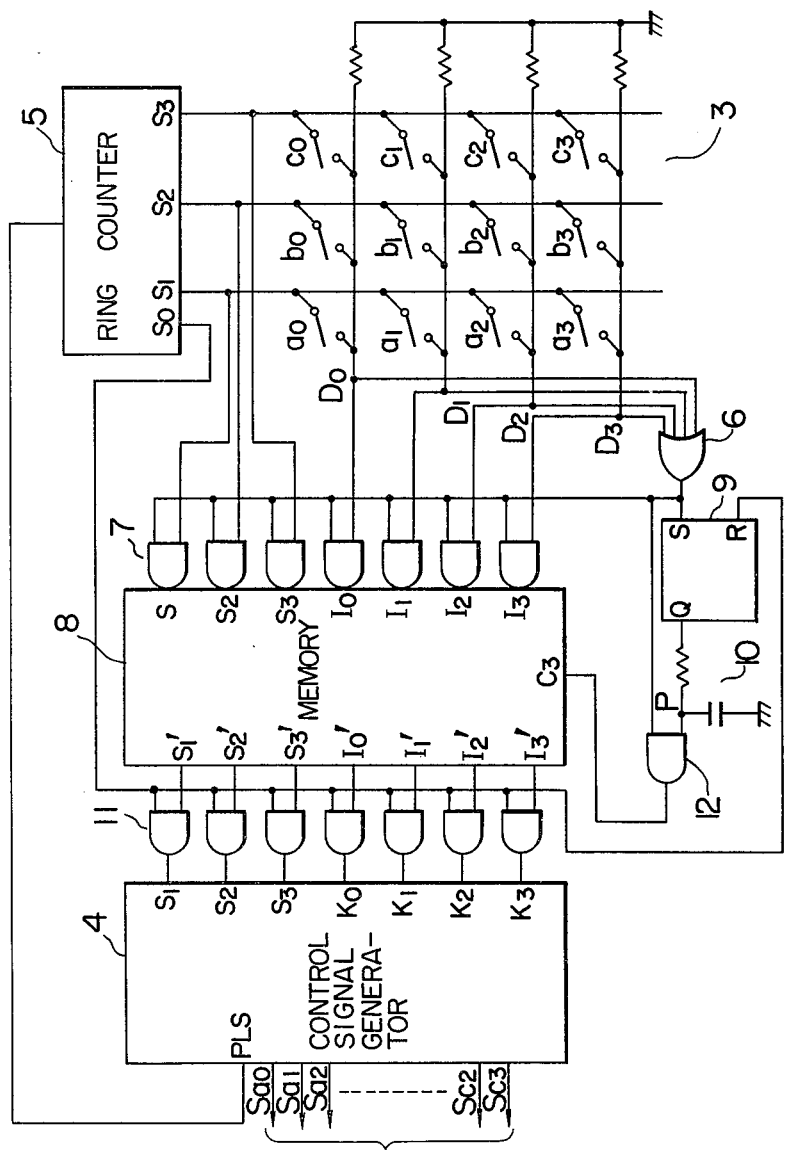
FIG. 3 shows a circuit diagram of an embodiment of an input signal recognition circuit according to the invention.
Figure 4:
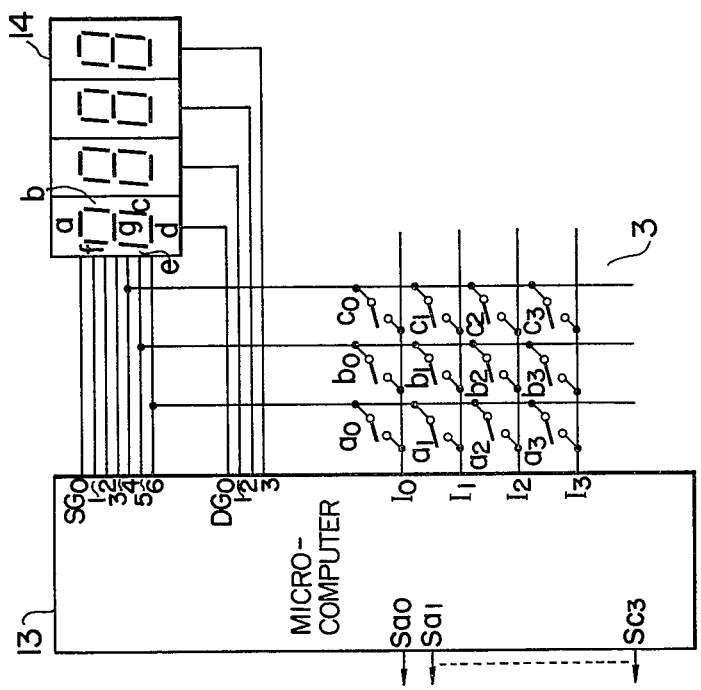
FIG. 4 shows a set of wave forms of the various signals at the respective portions in the input signal recognition circuit shown in FIG. 3.

Reference is first made to FIGS. 3 and 4 illustrating an embodiment of the input signal recognition circuit according to the invention and the wave forms at the respective portions of the recognition circuit, respectively. The explanation to first be given referring to these figures is the elaboration of the means to reject the acceptance of the empty key when a plurality of keys are simultaneously actuated and its construction as well. The key actuation in a key matrix 3 is sensed by three pulsate signals $S_1$ to $S_3$ with time widths corresponding to sequential time periods a, b and c. The sense signals $S_1$ to $S_3$ are produced through the counting clock pulses derived from a PLS output terminal of a control signal generator 4 by a ring counter 5. Blanking periods BL are provided between adjacent sense signals. The sense signals include a pulsate signal with a time width d for providing an H level to an $S_0$ terminal. The signal $S_0$ ($S_0$ is doubly used for designation, for easy explanation) appears after the key matrix 3 is completely scanned by the signals $S_1$ to $S_3$, that is, following the time periods a to c. The signal $S_0$ is used for recognizing the depressed key, as will be described later.

The explanation to follow is the procedure for recognizing a depressed key. Let us consider a case where a key $b_2$ is depressed. At the time period a, the data $D_0$ to $D_3$ from the key matrix are all at a L (low) level, so that the output of an OR gate 6 remains at a L level and AND gates 7 remain disabled. At this time, none of the key data $a_o$ to $a_3$ is loaded into a memory 8. At the succeeding period b, a key $b_2$ is ON and data $D_2$ is at H level. Accordingly, the output of the OR gate 6 becomes high in level to enable the AND gates 7 so that the key data $D_0$ to $D_3$ and the sense signals $S_1$ to $S_3$ are loaded into the memory 8. At this time, the key data "0010" and the sense signal data "010" are stored in the memory 8. The key data is not decoded till the time period d of the signal $S_0$. At this time, an SR flip-flop 9 is set and its output Q becomes high in level. The Q output signal passes through a delay circuit 10 including a capacitor C and a resistor R to change the potential at a point P as depicted by a curve P in FIG. 4. The level $V_{TH}$ is a threshold level. Accordingly, the signal P is digitally equivalent to a signal $P_D$ depicted below the signal P in FIG. 4. Note here that the signal $P_D$ becomes high in level during the blanking period BL between the signals b and c.

Then, the signal $S_2$ sweeps the keys $c_o$ to $c_3$ at the time period c. At this time, if the key data $D_0$ to $D_3$ are all at low level, the contents of the memory 8 are not rewritten. Therefore, at the next time period d, the key data by the key $b_2$ is decoded. At the time period d, AND gates 11 are enabled to permit the contents of the memory 8 to be inputted to the control signal generator 4. In this example, to the input terminals $S_1$ to $K_3$ are inputted "0100010". In other words, the fact that a $D_2$ port becomes high at the $S_2$ sweeping is inputted into the control signal generator 4. Upon receipt of this, the control signal generator 4 decodes this to produce fixed control signal $Sa_0$ to $Sc_3$ which in turn are used to process the operation command given by the depression key. At the same time, the flip-flop 9 is reset in preparation for the succeeding key-in operation.

Let us now consider a case where any one of the keys is actuated at the time period c. Also at this time, the output of the OR gate 6 is high in level and the gates 7 connected to the memory 8 are enabled. However, at this time, the point P has already become high in level so that the output of the AND gate 12 becomes high. As a result, a H level signal is applied to the clear terminal C of the memory 8 to erase the contents of the memory 8. Therefore, the data inputted to the control signal generator 4 is "0000000" which means a state that none of the keys is depressed. In other words, the writing of the key data into the memory 8 is permitted in the order of the periods a, b and c and only at the time point that the depression of the key is first detected. At the time period after the write-in of the key data, when the depression of any one of the keys is detected, the preceeding key data is erased and is never decoded.

With such a construction, the erroneous operation accepting the depression of the empty keys when three or more keys disposed on different columns are depressed is surely prevented without the diodes arranged as shown in FIG. 1. Therefore, the voltage drops of the input signal by the diodes is eliminated thereby to permit a relatively large margin to the threshold level.

Figure 5:
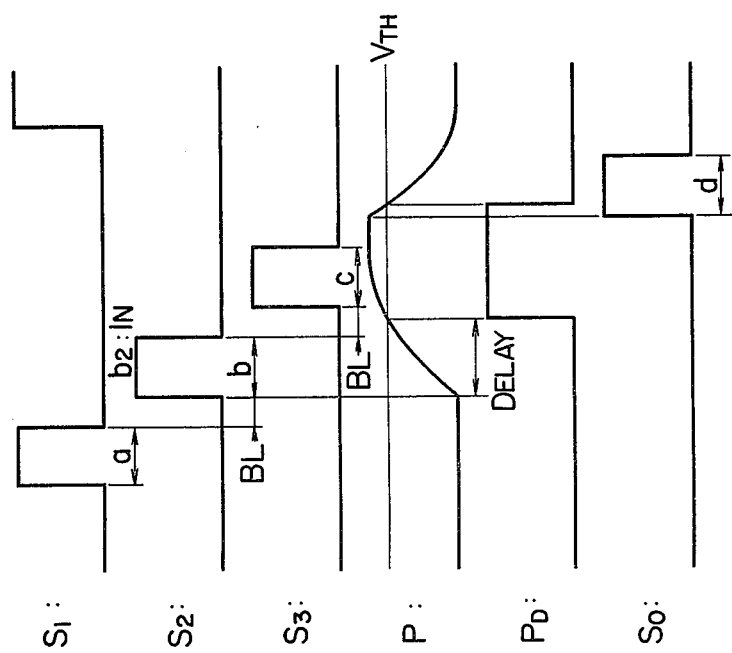
FIG. 5 shows a schematic diagram when the input signal recognition circuit according to the invention is applied to a control system with a display tube.

Explanation will be given of a modification of the invention in which the time to sense the key is shortened. A circuit shown in FIG. 5 is used when the invention is applied to a control system with display tubes which are lightened or driven dynamically. The signals at the respective parts in the circuit in FIG. 5 take the wave forms as shown in FIG. 6. The term dynamic lightening means to lighten display tubes one by one successively and repeatedly. In FIG. 5, reference numeral 13 designates a microcomputer including the memory 8, the control signal generator 4 having a combination of hard logic and soft logic, and the like. A display section 14 such as a fluorescent display tube of the dynamic drive type has four digits driven by the signals from the digit signal terminal $DG_0$ to $DG_3$ of the microcomputer 13. Each digit has seven segments for forming a proper numeral which are driven through the segment signal terminals $SG_0$ to $SG_6$. The actuation of keys in the key matrix is sensed by using the segment signal lines.

The digit signals are outputted from the terminals $DG_0$ to $DG_3$ to the four digit elements 14 successively in a circulating manner, whereby the digit elements are driven to effect a display of time or the like. The display element 14 has a long after glow time so that the display is performed continuously, not discontinuously. After the digit signals are successively outputted from the terminals $DG_0$ to $DG_3$, there is a blanking time producing no pulses from the terminals. During the blanking time, the segment signal lines connected to the switching elements 3 are used to provide paths of the sense signals. That is, the sense signals pass through the segment signal lines $SG_4$ to $SG_6$ to sense the switching elements 3. In short, this example executes the sensing operation by using the segment signal lines without using additional signal lines, during the vacant time of the display section. As described above, in this example, a dynamic drive type display is used for the display 14 and some of the segments signal lines are used as the sense signal lines. Accordingly, the microcomputer 13 can enjoy multifunctional operation without increasing the number of the terminals. This makes the microcomputer small in size.

As shown in FIG. 5, the signals at the respective portions execute the display and the key sensing during one period. Since in the key sensing operation or key sense mode all the columns of the key matrix 3 are simultaneously sensed, the segment signal lines $SG_4$ to $SG_6$ are simultaneously made high in level after the digit signals are erased. For this, all the key data of 12 are concurrently applied to the input terminals Io to I3 so that it can be instantly judged what key or keys are depressed in the key matrix. If no actuation of the key is detected, the operation therefore shifts to the succeeding display operation in a short time. Therefore, the blanking time rejecting the display operation may be shortened thereby to previously prevent reduction of the intensity or the flicker in the dynamic type display tube. (see NO DETECT CYCLE in FIG. 6). Incidentally, a dynamic drive display system is a display drive system in which a series of display elements are successively and repeatedly driven for display.

The explanation to follow is the procedure for decoding the key data. When the actuation of the key is sensed, that is to say, if any one of bits at the input terminals in the key sensing mode becomes high in level, the segment signal lines $SG_4$ to $SG_6$ immediately and successively become high in level to subsequently sense keys $a_0$ to $a_3$, $b_0$ to $b_3$ and $c_0$ to $c_3$ of three groups. The results of the sensing operation are stored in the memory (see, KEY DETECT (1) CYCLE).

Then the operation returns to the display cycle or the display mode to drive the display tube and then to enter the second key sense mode. The method of key sensing is similar to that of the first time key sensing. In the second key sensing, the key data loaded is compared with the key data stored in the first time key sensing. Only when both data are coincident with each other, is the key data of the corresponding key decoded to produce one of the given control signals $Sa_0$ to $Sc_3$ (see, KEY DETECT (2) CYCLE).

Accordingly, if noise is loaded in the first key sense mode, it is corrected in the second key sense mode, resulting in marked reduction in the erroneous operation of the system. Generally, chattering occurs due to the bouncing of the contact of the key immediately after the key is turned on and due to arc immediately after the key is turned off. However, when the time period of the dynamic drive operation is selected longer than the chattering time, the erroneous operation attributed to the chattering can be prevented. For example, when the chattering lasts 3 milliseconds, the selection of 5 milliseconds is satisfactory for the time period of one cycle of the dynamic drive operation.

The key sensing (WAIT RELEASE CYCLE) after the decoding of the key data will be described. After the decoding of the key data is finished, the system returns to the key sense mode as in the case of NO DETECT CYCLE. However, at this time the key still remains depressed so that the key data already decoded comes into the input terminal. The key data, however, is not decoded and the key sense mode is not reset until the key data become all zero again. Upon the reset of the key sense mode, the data in the memory is cleared and the control system is ready for the next actuation of the key.

As is described in the foregoing, a combination of the double check and the key release wait can provide an input signal recognition circuit insensitive to noise.

What is claimed is:

1. An input signal recognition circuit comprising:
   an input section having a plurality of switching elements arranged in rows and columns forming an electrical matrix for keying in operation commands;
   a sense signal generating section for cyclically producing, on a plurality of sense lines respectively connected to the switching elements in a column of said matrix, respective sense signals, the sense signals in each cycle being sequentially produced on said plurality of sense lines to provide a sense signal sequence which successively scans said sense lines;
   a control section including a memory section for storing row data indicating the activated switching elements in a column of said matrix, said row data being detected by said control section during the presence of a sense signal on a sense line associated with a column of said matrix, said control section decoding data stored in said memory section and producing an output representing said row data after all sense lines associated with columns of said matrix have been scanned by respective sensing signals in a sense signal cycle, said control section clearing the contents of said memory section and supplying no output representing row data when, in a sense signal cycle, row data is detected from different columns of said matrix.

2. An input signal recognition circuit according to claim 1, wherein said sense signal generating circuit periodically produces simultaneous sense signals on all of said sense lines and said control section detects, during simultaneous production of sense signals, whether any switching element of said matrix is activated, said control section causing said sense signal generating circuit to produce said sense signal scanning sequence if an activated switching element is detected during the simultaneous production of sense signals on said sense lines.

3. An input recognition circuit according to claim 1, wherein said memory section stores row data representing activated switching elements during a first sense signal cycle and said control section compares row data stored in said memory section with row data detected during a second subsequent sense signal cycle, said control section decoding data stored in said memory section and producing an output representing said stored row data only when the stored row data detected during said first sense signal cycle is coincident with the row data detected during said second sense signal cycle.

* * * * *